(12) United States Patent
Gao et al.

(10) Patent No.: US 7,677,874 B2
(45) Date of Patent: Mar. 16, 2010

(54) VACUUM MOLDING APPARATUS

(75) Inventors: Zheng Yu Gao, Singapore (SG); Shu Chuen Ho, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 490 days.

(21) Appl. No.: 11/670,691

(22) Filed: Feb. 2, 2007

(65) Prior Publication Data
US 2008/0187615 A1    Aug. 7, 2008

(51) Int. Cl.
*H01L 21/56*    (2006.01)
*B29C 45/14*    (2006.01)

(52) U.S. Cl. .................. 425/127; 425/129.1; 425/544; 425/812

(58) Field of Classification Search ............. 425/127, 425/129.1, 544, 812
See application file for complete search history.

(56) References Cited

U.S. PATENT DOCUMENTS 5,665,281 A * 9/1997 Drummond .............. 264/39
5,779,958 A * 7/1998 Nishihara et al. .......... 264/161
6,007,317 A * 12/1999 Mess ......................... 425/125
6,258,314 B1 * 7/2001 Oida et al. .................. 264/511
2005/0106784 A1 * 5/2005 Xia ............................ 438/125

FOREIGN PATENT DOCUMENTS

JP    54153866 A * 12/1979
JP    2000043096 A * 2/2000

* cited by examiner

*Primary Examiner*—Robert B Davis
(74) *Attorney, Agent, or Firm*—Ostrolenk Faber LLP

(57) ABSTRACT

A molding apparatus is provided for molding a leadframe, the molding apparatus comprising a mold having a leadframe-receiving area on its surface that is configured to receive and clamp the leadframe in the leadframe-receiving area. At least one molding cavity and a plurality of vacuum suction holes formed adjacent to the molding cavity are located within the leadframe-receiving area. The vacuum suction holes are operative to evacuate air from the mold surface, especially the molding cavity, through air vents connecting the vacuum suction holes to the molding cavity.

4 Claims, 2 Drawing Sheets

VACUUM MOLDING APPARATUS

FIELD OF THE INVENTION

The invention relates to the molding of electronic devices, and in particular, to the molding of electronic devices in molding cavities that are subjected to vacuum suction during molding.

BACKGROUND AND PRIOR ART

During the assembly of semiconductor packages, semiconductor chips are often attached onto carriers, such as substrates or leadframes, for processing multiple semiconductor chips at the same time. After or during attachment, electrical connections are made between electrical pads on the chips to corresponding contacts or connection pads on the substrates or leadframes. This can be done by wire bonding, or the electrical pads can be directly attached onto the contacts on the substrates or leadframes. Thereafter, it is usually necessary to protect the chips and the electrical connections from the environment by encapsulating them in a molding compound, such as epoxy molding compound ("EMC").

In a typical transfer molding process, the substrate or leadframe with the chips attached is placed into a molding system comprising two mold halves. One or more molding cavities are formed in one or both of the mold halves corresponding to the positions of the chips to be encapsulated. Molding compound is introduced into mold supply pots in the molding system, typically in pellet form. The mold supply pots are linked to the molding cavities through a system of runners and gates through which the molding compound is channeled before entering the cavities. A plunger is insertable into each pot under heat and pressure to crush the pellet and distribute molding compound under the pressure from the plunger through the system of runners and gates and into the molding cavities.

FIG. 1 is a plan view of a surface of a conventional mold chase 100. Only one mold half is shown, which cooperates with another mold half to clamp a carrier for molding. The mold chase 100 includes cavities 102 which are configured for molding semiconductor chips located on leadframes 104. The parts of a leadframe 104 that require molding are positioned onto corresponding cavities 102 of the mold chase 100 during onloading.

Molding compound is introduced to the mold chase 100 via pellets (not shown) that are crushed at the cull areas 106 to liquefy the molding compound. The liquefied molding compound travels from the cull areas 106 into runners 108 and are then introduced into the cavities 102.

During molding, it is preferable that the cavities 102 are in a substantially vacuum condition so that air gaps will not form in the cavities 102 during molding. Therefore, vacuum holes 110 are formed outside the leadframe 104 location and near to the periphery of the mold chase 100. The vacuum holes 110 are connected to a vacuum pump (not shown) to suck out air from the cavities 102.

Air vents 112 are formed adjacent to the cavities 102 so that paths are created for the air inside the cavities 102 to flow towards the vacuum holes 110. For comparison, the air vents 112 are only illustrated on one set of molding cavities 102 for molding a leadframe 104, but it should be appreciated that air vents 112 should be present with respect to all the cavities 102. The air vents 112 are in the form of depressions located in between clamping areas 114 of the mold chase 100 that are operative to clamp the leadframe 104 tightly onto another mold half during molding.

In order to maintain a vacuum pressure in the mold chase 100, the vacuum area has to be sealed off from the ambient atmosphere. To perform sealing, a seal ring 116, typically in the form of a gasket or O-ring, is used to surround the vacuum holes 110 near to the periphery of the mold chase 100. A relief area 118 is formed just inside the seal ring 116 adjacent to the vacuum holes 110 to create paths for air to travel between the cavities 102 and air vents 112 into the vacuum holes 110.

While the above design is suitable for most molding purposes, it is not ideal as the seal ring 116 is vulnerable to wear failure after prolonged use and exposure to heat. Typically, it lasts only for a few months. Also, it is prone to damage, for example when it accidentally comes into contact with a sharp foreign material, especially when the mold is being closed to clamp the carrier to be molded.

There is a further risk of mold bleed occurring during molding such that the molding compound may then come into contact with the seal ring 116. This will also cause damage to the sealing ring 116. Meanwhile, since the seal ring 116 is exposed, there is always a risk of other accidental damage occurring due to human error.

SUMMARY OF THE INVENTION

It is thus an object of the invention to seek to provide an effective and durable means to create and contain vacuum in a mold while avoiding the use of the aforementioned seal rings in the mold that are susceptible to relatively higher wear and tear or other damage.

Accordingly, the invention provides a molding apparatus for molding a leadframe, comprising: a mold having a leadframe-receiving area on its surface that is configured to receive and clamp the leadframe in the leadframe-receiving area; at least one molding cavity located in the leadframe-receiving area; a plurality of vacuum suction holes formed adjacent to the molding cavity and located within the leadframe-receiving area, the vacuum suction holes being operative to evacuate air from the mold surface; and air vents connecting the vacuum suction holes to the molding cavity.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a vacuum molding apparatus in accordance with the invention will now be described with reference to the accompanying drawings, in which.

DETAILED DESCRIPTION OF THE PREFERRED EMBODIMENT OF THE INVENTION

Figure 1:
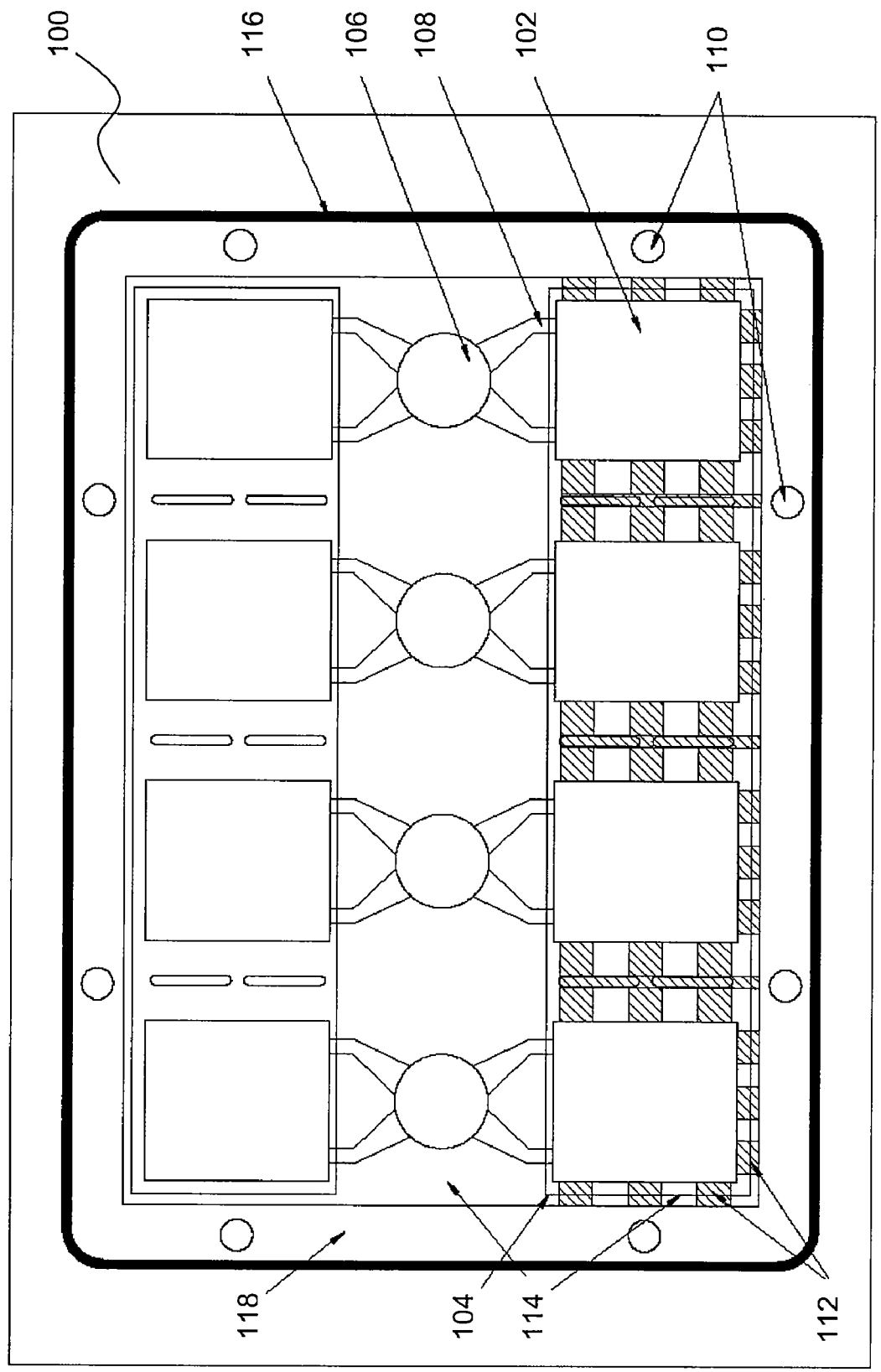
FIG. 1 is a plan view of a surface of a conventional mold chase.
Figure 2:
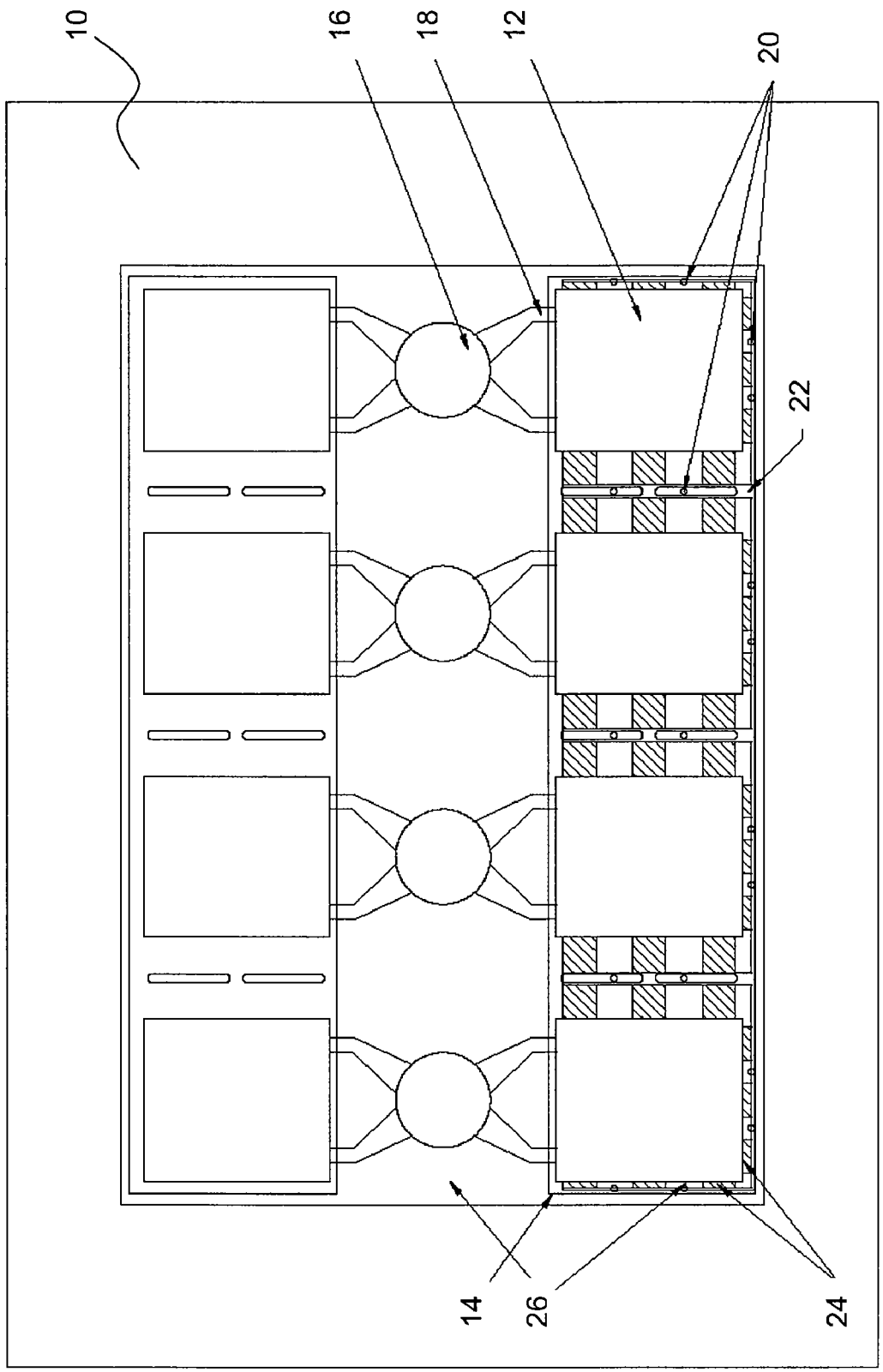
FIG. 2 is a plan view of a surface of a mold chase according to the preferred embodiment of the invention.

FIG. 2 is a plan view of a surface of a mold chase 10 according to the preferred embodiment of the invention. As before, only one mold half is shown, which cooperates with another mold half to clamp a carrier for molding. The mold chase 10 includes one or more molding cavities 12 which are configured for molding semiconductor chips located on leadframes. The mold chase 10 has leadframe-receiving areas 14 on its surface, each of which is configured to receive and clamp a leadframe in the leadframe-receiving area 14 for molding.

The portions of the leadframe to be molded are positioned onto corresponding cavities 12 within the leadframe-receiving area 14 when the leadframe is placed into the leadframe-receiving area 14 of the mold chase during onloading.

Molding compound in the form of pellets (not shown) are introduced to the mold chase 10 at the cull areas 16, whereat they are crushed under heat and pressure to liquefy the molding compound. From the cull areas 16, the liquefied molding compound is transferred to the cavities 12 by way of runners 18 connecting the cull areas 16 to the cavities 12.

In order to create vacuum in the cavities 12 during molding, a plurality of vacuum suction holes 20 is formed in the mold chase 10 adjacent to the cavities 12 for drawing and evacuating air from the mold surface. Instead of being located near the periphery of the mold chase 10, the vacuum suction holes 20 are located at the position of the leadframe within the leadframe-receiving area 14. Where there are multiple molding cavities 12 in the leadframe-receiving area 14 as shown in FIG. 2, then vacuum suction holes 20 should preferably also be formed between adjacent molding cavities.

The vacuum suction holes 20 are preferably located within one or more vacuum slots 22 formed in the mold surface within the leadframe-receiving area 14, each vacuum slot being located next to a respective cavity 12. The vacuum suction holes 20 are connected to a vacuum pump (not shown) to suck out air from the cavities 12.

There are air vents 24 connecting the cavities 12 to the vacuum slots 22, and the air vents are preferably located in between clamping areas 26 for clamping the leadframe. In this way, paths are created for air to be drawn out from the cavities 12, through the air vents and vacuum slots 22 into the vacuum suction holes 20, when a leadframe is clamped by the mold chase 10. The air vents 24 should be of a sufficient depth to allow air to pass through, but thin enough to substantially block liquefied molding compound from entering the air vents 24.

The aforesaid design avoids the need to have a large seal ring near the periphery of the mold chase 10. Instead, the vacuum condition is maintained by the leadframe being clamped by the clamping areas 26 in the mold chase 10 during molding such that the leadframe forms a seal with the mold chase 10 to isolate the vacuum suction holes 20 from the ambient atmosphere. Accordingly, the vacuum pressure in each cavity 12 is localized substantially at the respective cavity position, and the material of the leadframe is used as a vacuum seal during molding.

It would be appreciated that it is advantageous to use the material of the carrier as a seal during molding because each molding cycle introduces a fresh leadframe or substrate, and therefore new sealing is automatically provided at each molding cycle. This results in proper sealing without the need for seal maintenance. Moreover, it results in cost savings as there is no need to provide an external seal ring, such as a gasket or O-ring.

Another advantage is that unnecessary downtime can be avoided by avoiding the need to change the conventional external seal rings. There is thus improved reliability since using the leadframe as a seal avoids the problem of wear and tear or damage of the sealing material, as faced in conventional mold chases.

The invention described herein is susceptible to variations, modifications and/or additions other than those specifically described and it is to be understood that the invention includes all such variations, modifications and/or additions which fall within the spirit and scope of the above description.

The invention claimed is:

1. A molding apparatus for molding a leadframe, comprising:
   a mold having a leadframe-receiving area on its surface that is configured to receive and clamp the leadframe in the leadframe-receiving area;
   at least one pair of adjacent molding cavities located in the leadframe-receiving area;
   vacuum suction holes formed at least between the pair of molding cavities and located within the leadframe-receiving area, the vacuum suction holes being operative to evacuate air from the mold surface by vacuum suction; and
   air vents connecting the vacuum suction holes to the pair of molding cavities.

2. The molding apparatus as claimed in claim 1, further comprising one or more vacuum slots formed in the mold surface within the leadframe-receiving area for locating the vacuum suction holes therein.

3. The molding apparatus as claimed in claim 1, wherein the air vents are located in between clamping areas for clamping the leadframe.

4. The molding apparatus as claimed in claim 3, wherein the clamping areas are constructed and configured to clamp onto the leadframe during molding such that the leadframe forms a seal with the mold to isolate the vacuum suction holes from an ambient atmosphere.

\* \* \* \* \*